(12) United States Patent  (10) Patent No.: US 9,603,238 B2
Takahashi et al.  (45) Date of Patent: *Mar. 21, 2017

(54) COMBINED WIRING BOARD

(71) Applicant: IBIDEN CO., LTD., Ogaki-shi (JP)

(72) Inventors: Michimasa Takahashi, Ogaki (JP); Teruyuki Ishihara, Ogaki (JP)

(73) Assignee: IBIDEN CO., LTD., Ogaki-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/076,586

(22) Filed: Nov. 11, 2013

(65) Prior Publication Data

US 2014/0133110 A1  May 15, 2014

(30) Foreign Application Priority Data

Nov. 9, 2012  (JP) ................................ 2012-247047
Mar. 12, 2013  (JP) ................................ 2013-049088

(51) Int. Cl.
*H05K 1/02* (2006.01)
*H05K 1/14* (2006.01)
(Continued)

(52) U.S. Cl.
CPC ............. *H05K 1/0271* (2013.01); *H05K 1/14* (2013.01); *H05K 1/183* (2013.01);
(Continued)

(58) Field of Classification Search
CPC ............... H05K 1/0271; H05K 3/0097; H05K 2203/0169; H05K 2201/09145; H05K 2201/209; H05K 2201/068; H05K 2201/10424; H05K 1/0201; H05K 1/14; H05K 1/183; H05K 3/071; H05K 3/05;
(Continued)

(56) References Cited

U.S. PATENT DOCUMENTS 5,866,852 A * 2/1999 Benz et al. .................... 174/255
6,707,288 B2 * 3/2004 Keating .................... 324/756.02
(Continued)

FOREIGN PATENT DOCUMENTS

JP  2003-69190 A  3/2003
JP  2011-023657  2/2011
(Continued)

OTHER PUBLICATIONS

Office Action issued Sep. 19, 2014 in Korean Patent Application No. 2013-134229.
U.S. Appl. No. 14/077,563, filed Nov. 12, 2013, Ishihara, et al.
U.S. Appl. No. 14/076,554, filed Nov. 11, 2013, Ishihara, et al.

*Primary Examiner* — Ishwarbhai B Patel
(74) *Attorney, Agent, or Firm* — Oblon, McClelland, Maier & Neustadt, L.L.P.

(57) ABSTRACT

A combined wiring board has multiple piece components each including a wiring board, and a frame component having an accommodation opening portion and holding the multiple piece components in the accommodation opening portion such that each of the piece components is fixed to the frame component at an outer rim of each of the piece components. The frame component has a thermal expansion coefficient in a planar direction which is set higher than a thermal expansion coefficient of the multiple piece components in the planar direction.

20 Claims, 16 Drawing Sheets

(51) Int. Cl.
*H05K 1/16* (2006.01)
*H05K 1/18* (2006.01)
*H05K 3/00* (2006.01)

(52) U.S. Cl.
CPC ..... *H05K 3/0097* (2013.01); *H05K 2201/068* (2013.01); *H05K 2201/09145* (2013.01); *H05K 2201/209* (2013.01); *H05K 2203/0169* (2013.01)

(58) Field of Classification Search
CPC .......... H05K 2201/09063; H05K 2201/09072; H05K 3/0165; H05K 3/0169; H05K 3/0173
USPC ......... 174/250–258, 529–536; 361/752, 760, 361/792–795, 805, 810, 813; 257/666
See application file for complete search history.

(56) References Cited

U.S. PATENT DOCUMENTS

| | | | |
|---|---|---|---|
| 8,502,081 B2 * | 8/2013 | Kanemaru et al. | 174/255 |
| 8,741,411 B2 | 6/2014 | Yada | |
| 9,277,650 B2 * | 3/2016 | Ishihara | H05K 1/142 |
| 9,277,655 B2 * | 3/2016 | Ishihara | H05K 1/142 |
| 2006/0169486 A1 * | 8/2006 | Funada et al. | 174/254 |
| 2011/0096517 A1 * | 4/2011 | Yada et al. | 361/752 |

FOREIGN PATENT DOCUMENTS

| | | |
|---|---|---|
| TW | 201019806 A1 | 5/2010 |
| TW | 201044928 A1 | 12/2010 |
| TW | 201044932 A1 | 12/2010 |

* cited by examiner

FIG. 3
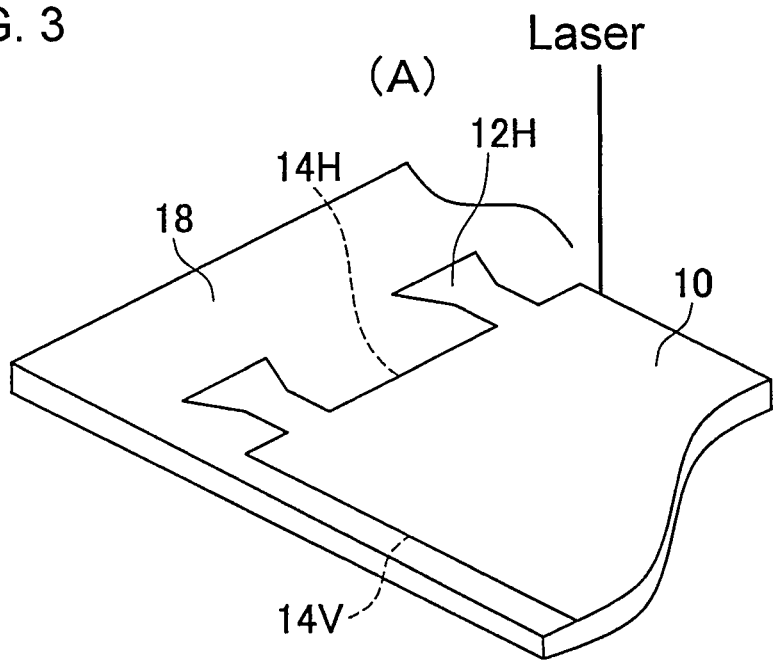
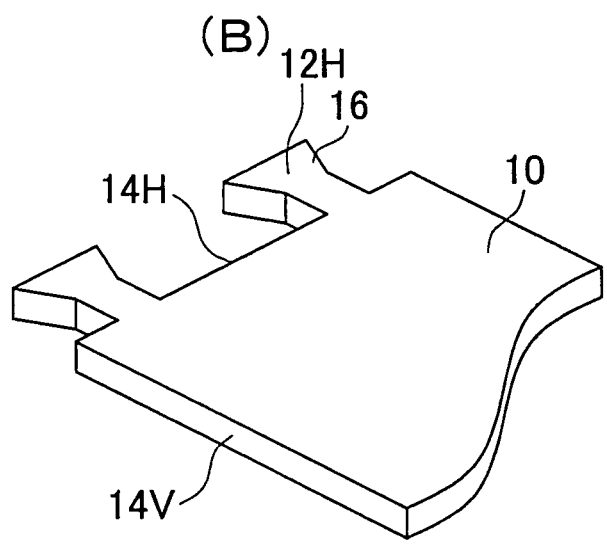

FIG. 4
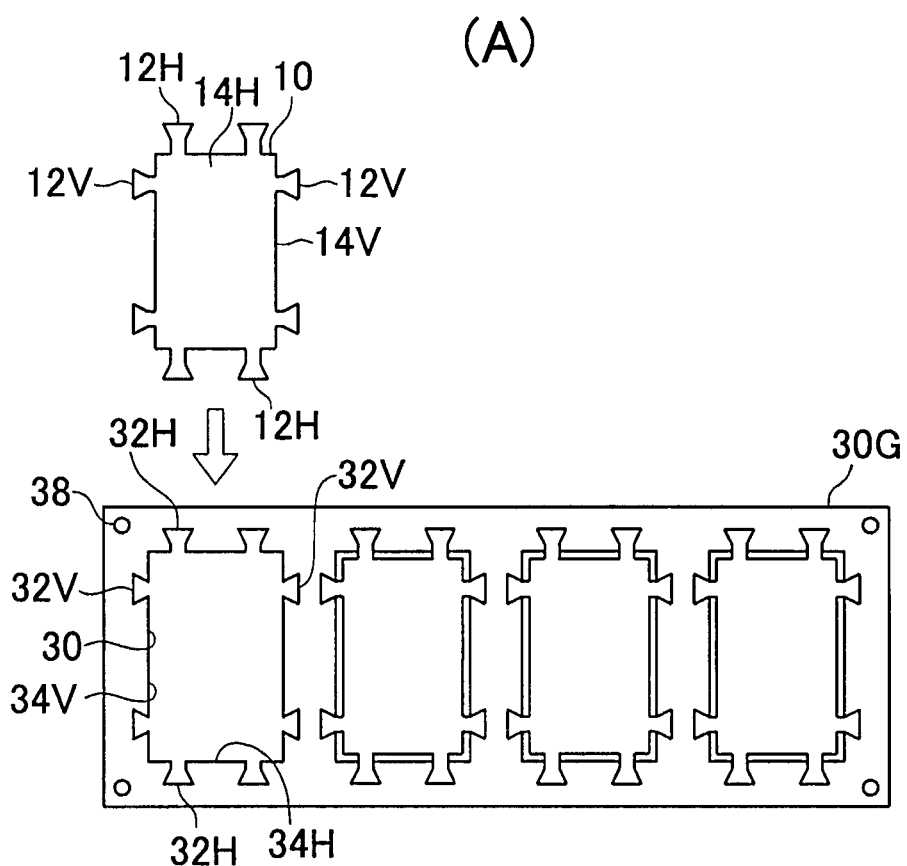
(A)
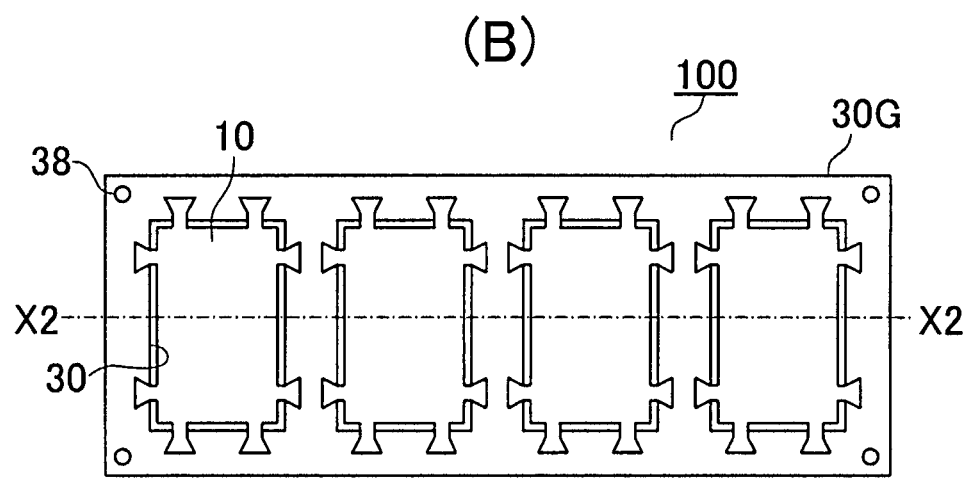
(B)

FIG. 14
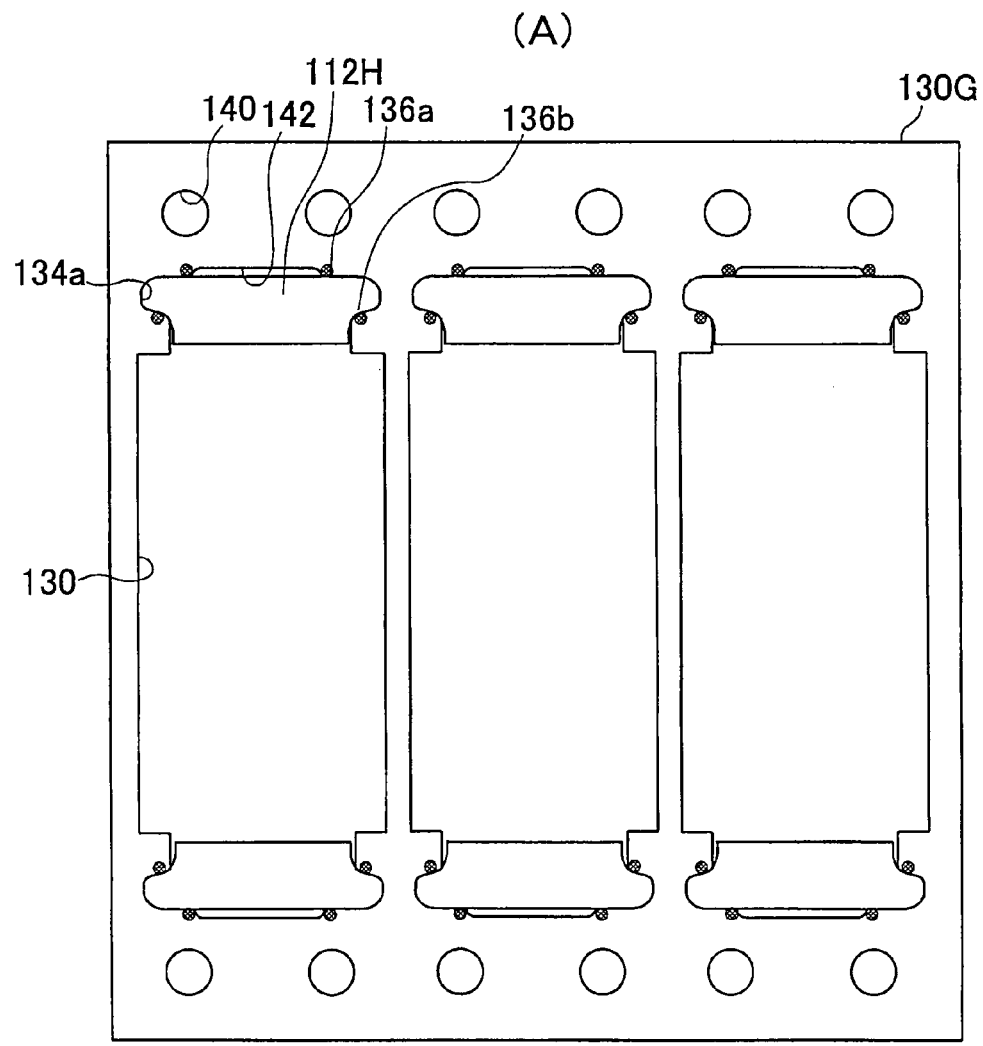
(A)
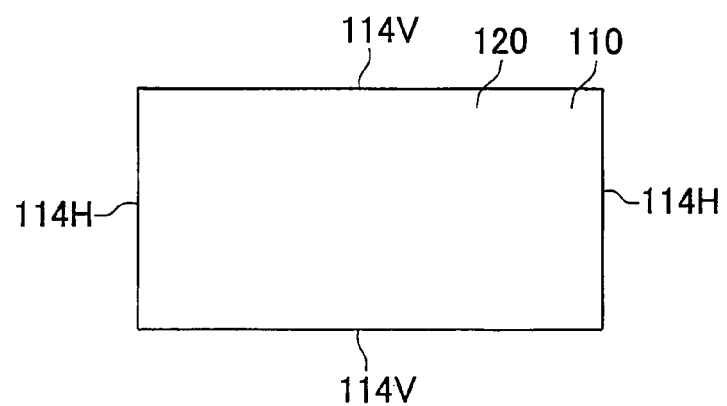
(B)

COMBINED WIRING BOARD

CROSS-REFERENCE TO RELATED APPLICATIONS

The present application is based upon and claims the benefit of priority to Japanese Patent Application Nos. 2012-247047, filed Nov. 9, 2012 and 2013-049088, filed Mar. 12, 2013. The entire contents of these applications are incorporated herein by reference.

BACKGROUND OF THE INVENTION

Field of the Invention

The present invention relates to a combined wiring board in which wiring boards to undergo a reflow process are fixed by a frame.

Description of Background Art

Mounting an electronic component on a wiring board or applying another process may be performed by accommodating multiple identical wiring boards in one wiring board accommodation kit. JP 2011-23657 A describes a multi-piece wiring board accommodation kit made up of multiple piece wiring boards and a frame which includes accommodation holes to accommodate the piece wiring boards. The entire contents of this publication are incorporated herein by reference.

SUMMARY OF THE INVENTION

According to one aspect of the present invention, a combined wiring board has multiple piece components each including a wiring board, and a frame component having an accommodation opening portion and holding the multiple piece components in the accommodation opening portion such that each of the piece components is fixed to the frame component at an outer rim of each of the piece components. The frame component has a thermal expansion coefficient in a planar direction which is set higher than a thermal expansion coefficient of the multiple piece components in the planar direction.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 3A-3B are perspective views of a printed wiring board subjected to laser processing;

FIG. 4A is a plan view of a metal frame; FIG. 4B is a plan view of a combined wiring board;

FIG. 14A is a plan view of a metal frame according to the second embodiment;

FIG. 14B is a plan view of the printed wiring board;

DETAILED DESCRIPTION OF THE EMBODIMENTS

Figure 1:
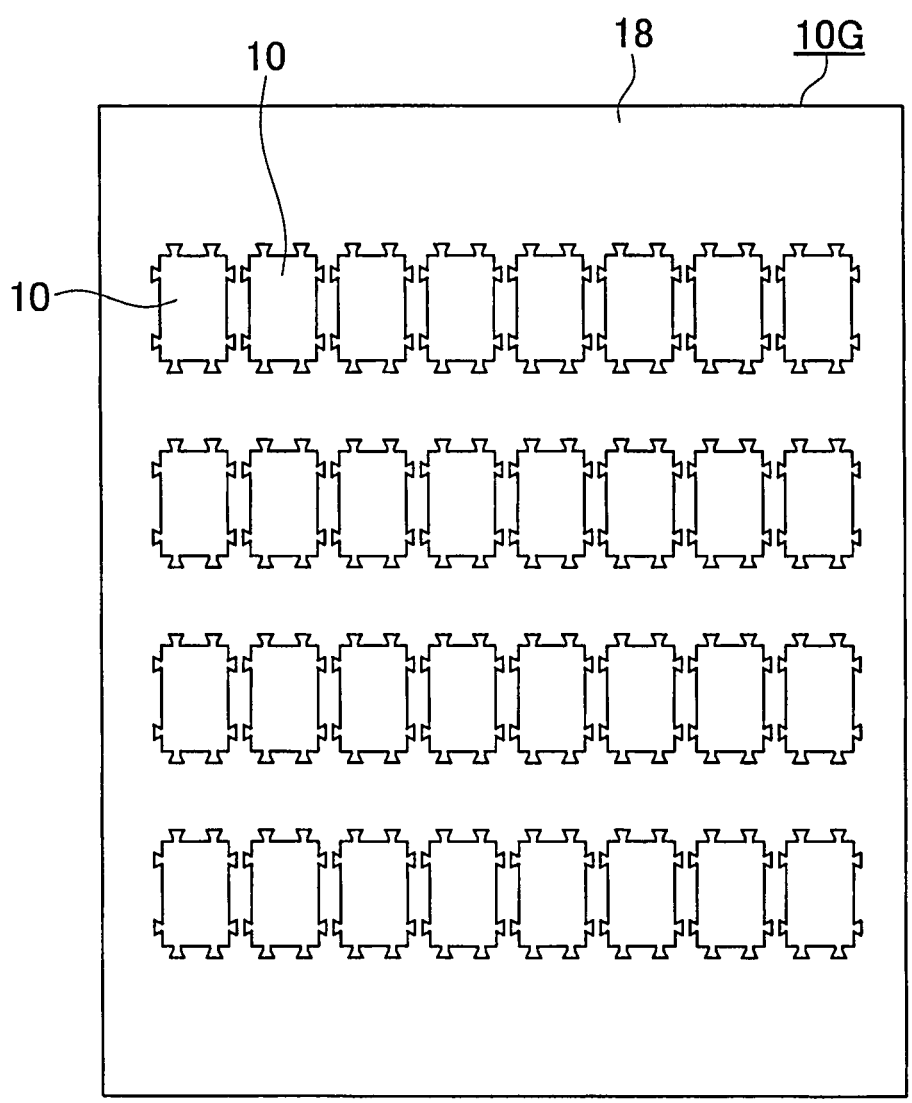
FIG. 1 is a plan view of a multicavity printed wiring board.

The embodiments will now be described with reference to the accompanying drawings, wherein like reference numerals designate corresponding or identical elements throughout the various drawings.

First Embodiment

Figure 10:
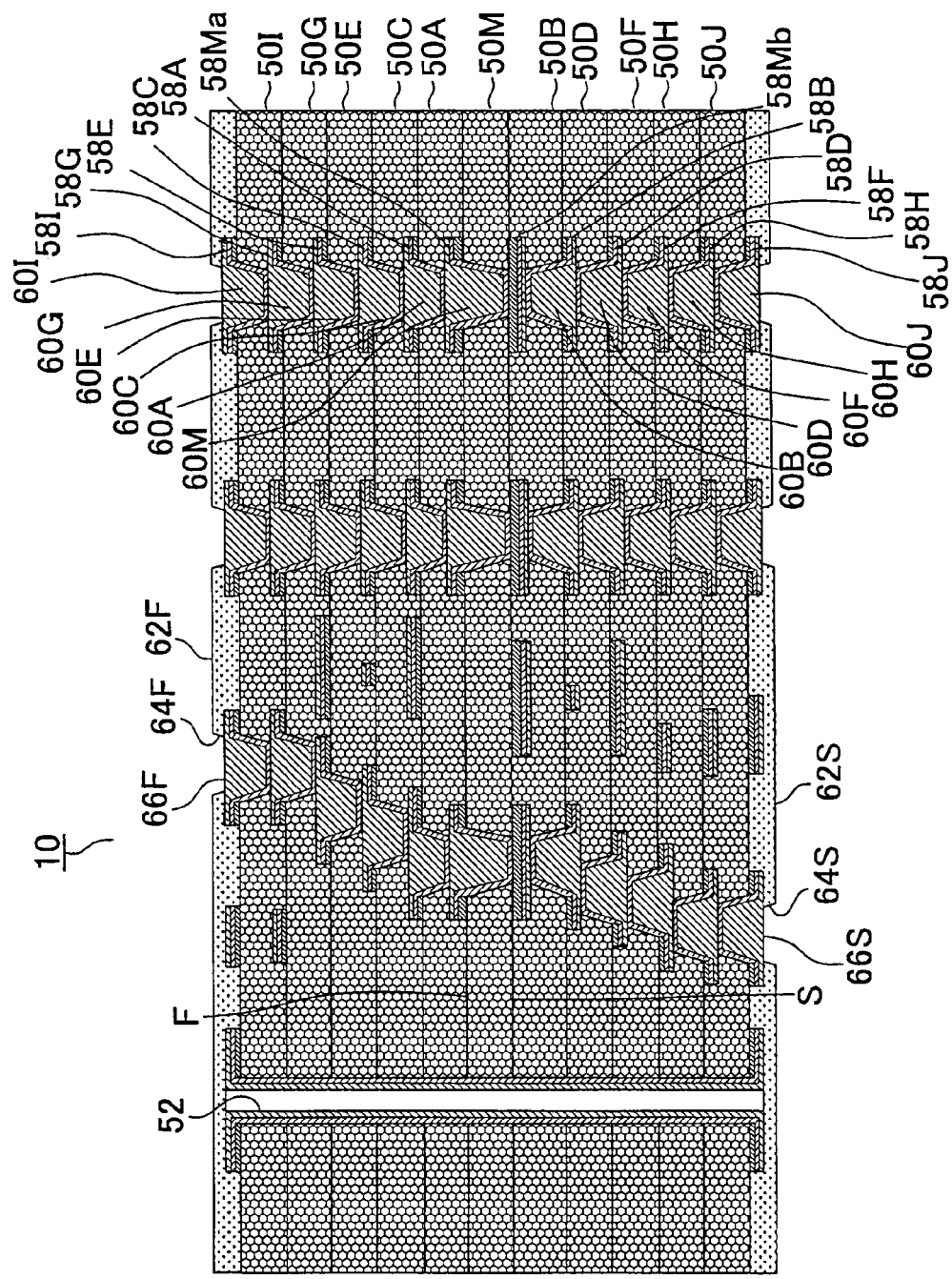
FIG. 10 is a cross-sectional view of the printed wiring board according to the first embodiment.

FIG. 10 is a cross-sectional view of the printed wiring board according to the first embodiment before electronic components are mounted.

A printed wiring board 10 is formed by laminating interlayer insulation layers (50A, 50C, 50E, 50G, 50I) on a first-surface (F) side of a core insulation layer (50M) arranged in the center, and laminating interlayer insulation layers (50B, 50D, 50F, 50H and 50J) on a second-surface (S) side. A conductive circuit (58Ma) of the first surface (F) of the core insulation layer (50M) and a conductive circuit (58Mb) of the second surface (S) are connected through a via conductor (60M). A core material is arranged in the core insulation layer (50M), and core materials are also arranged in the interlayer insulation layers (50A, 50C, 50E, 50G, 50I) and also in the interlayer insulation layers (50B, 50D, 50F, 50H, 50J).

In the interlayer insulation layer (50A) laminated on the first-surface (F) side of the core insulation layer (50M), a via conductor (60A) is formed to connect the conductive circuit (58A) on the interlayer insulation layer (50A) to the conductive circuit (58Ma) on the core insulation layer (50M). In the interlayer insulation layer (50C) laminated on the interlayer insulation layer (50A), a via conductor (60C) is formed to connect the conductive circuit (58C) on the interlayer insulation layer (50C) to the conductive circuit (58A) on the interlayer insulation layer (50A). In the interlayer insulation layer (50E) laminated on the interlayer insulation layer (50C), a via conductor (60E) is formed to connect the conductive circuit (58E) on the interlayer insulation layer (50E) to the conductive circuit (58C) on the interlayer insulation layer (50C). In the interlayer insulation layer (50O) laminated on the interlayer insulation layer (50E), a via conductor (60G) is formed to connect the conductive circuit (58G) on the interlayer insulation layer (50G) to the conductive circuit (58E) on the interlayer insulation layer (50E). In the interlayer insulation layer (50I) laminated on the interlayer insulation layer (50G), a via conductor (60I) is formed to connect the conductive circuit (58I) on the interlayer insulation layer (50I) to the conductive circuit (58G) on the interlayer insulation layer (50G). A solder-resist layer (62F) is formed on the interlayer insulation layer (50I), and the conductive circuit (58I) exposed from an opening (64F) of the solder-resist layer forms a pad (66F).

In the interlayer insulation layer (50B) laminated on the second-surface (S) side of the core insulation layer (50M), a via conductor (60B) is formed to connect the conductive circuit (58B) on the interlayer insulation layer (50B) to the conductive circuit (58Mb) on the core insulation layer (50M). In the interlayer insulation layer (50D) laminated on the interlayer insulation layer (50B), a via conductor (60D) is formed to connect the conductive circuit (58D) on the interlayer insulation layer (50D) to the conductive circuit (58B) on the interlayer insulation layer (50B). In the interlayer insulation layer (50F) laminated on the interlayer insulation layer (50D), a via conductor (60F) is formed to connect the conductive circuit (58F) on the interlayer insulation layer (50F) to the conductive circuit (58D) on the interlayer insulation layer (50D). In the interlayer insulation layer (50H) laminated on the interlayer insulation layer (50F), a via conductor (60H) is formed to connect the conductive circuit (58H) on the interlayer insulation layer (50H) to the conductive circuit (58F) on the interlayer insulation layer (50F). In the interlayer insulation layer (50J) laminated on the interlayer insulation layer (50H), a via conductor (60J) is formed to connect the conductive circuit (58J) on the interlayer insulation layer (50J) to the conductive circuit (58H) on the interlayer insulation layer (50H). A solder-resist layer (62S) is formed on the interlayer insulation layer (50J), and the conductive circuit (58J) exposed from an opening (64S) of the solder-resist layer forms a pad (66S). A through hole 52 is formed to penetrate through the interlayer insulation layers (50I, 50G, 50E, 50C, 50A, 50M, 50B, 50D, 50F, 50H, 50J).

Figure 11:
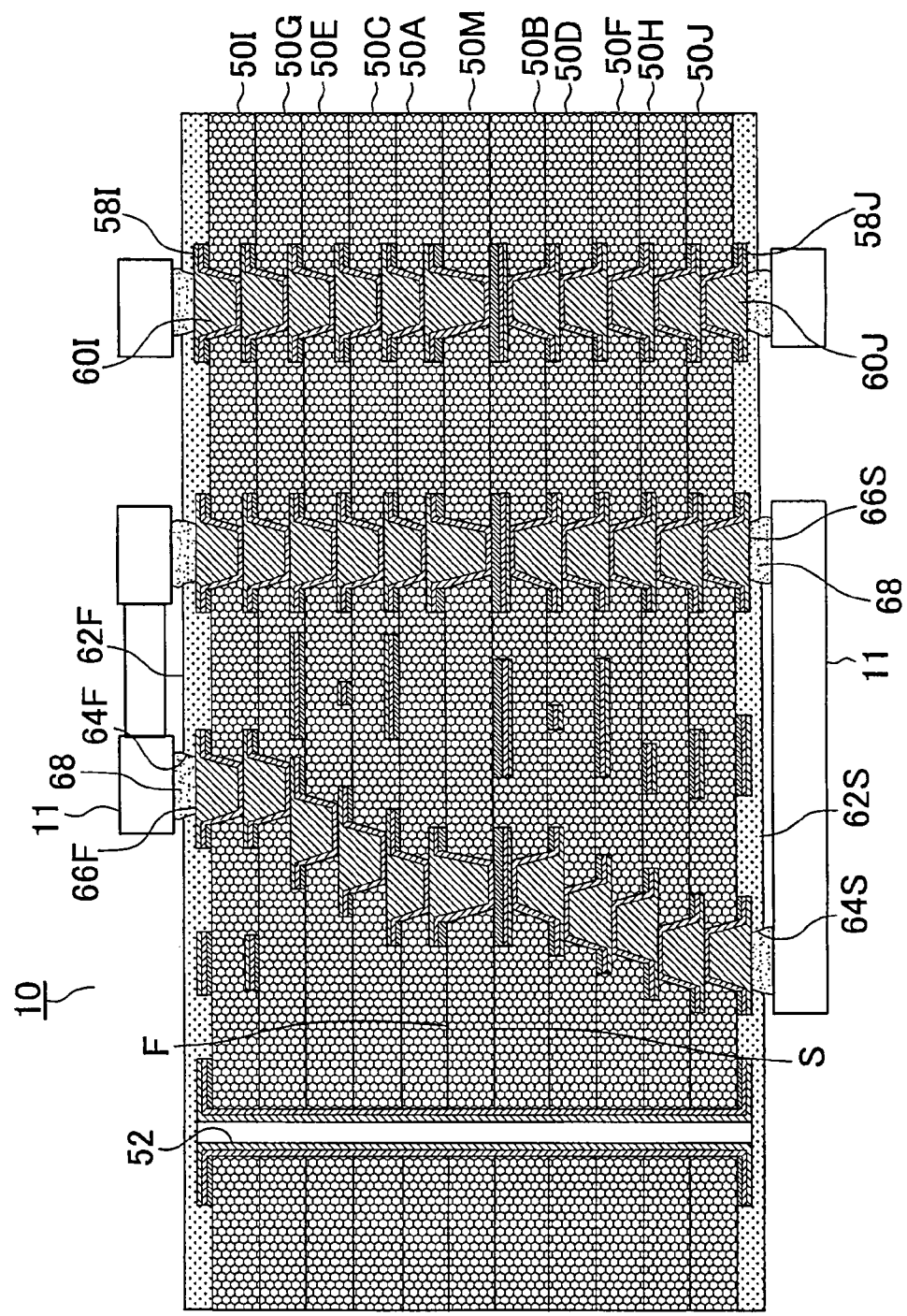
FIG. 11 is a cross-sectional view of the printed wiring board on which electronic components are mounted according to the first embodiment.

FIG. 11 is a cross-sectional view of the printed wiring board on which electronic components are mounted.

On the first-surface (F) side of the printed wiring board, an electronic component 11 is mounted via a solder 68 provided on the pad (66F). On the second-surface side, the electronic component 11 is mounted via the solder 68 provided on the pad (66S).

Figure 2:
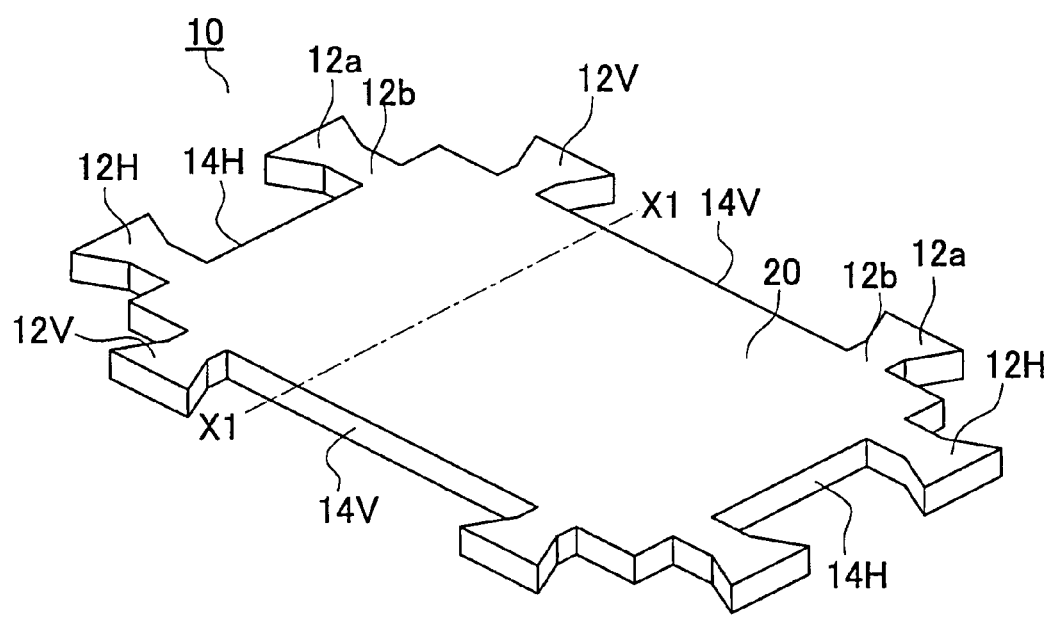
FIG. 2 is a perspective view of a printed wiring board cut into a piece.

FIG. 1 is a plan view of a multicavity printed wiring board (10G) which includes 8×4 manufactured printed wiring boards 10, and FIG. 2 is a perspective view of a printed wiring board 10 cut out into a piece. FIG. 10 illustrates part of an (X1-X1) cross-section in FIG. 2.

As illustrated in FIG. 1, the printed wiring boards 10 are manufactured inside a frame component 18 on an outer periphery of the multicavity printed wiring board (10G). As illustrated in FIG. 2, in the printed wiring board 10, two support portions (12V) are each formed on a long-side sidewall (14V) on a side of a rectangular main body portion 20 to face each other across the main body portion. Two support portions (12H) are each formed on a short-side sidewall (14H) on a side to face each other across the main body portion. The support portions (12V) and the support portions (12H) have the same shape, and each has a rectangular base portion (bridge portion) (12b) and a trapezoidal portion (12a) with a width increasing toward the tip.

In the first embodiment, when the printed wiring boards 10 are cut out from the multicavity printed wiring board (10G), each printed wiring board is cut out by laser along the outline as illustrated in FIG. 3A and cut into a piece as illustrated in FIG. 3B.

Figure 5:
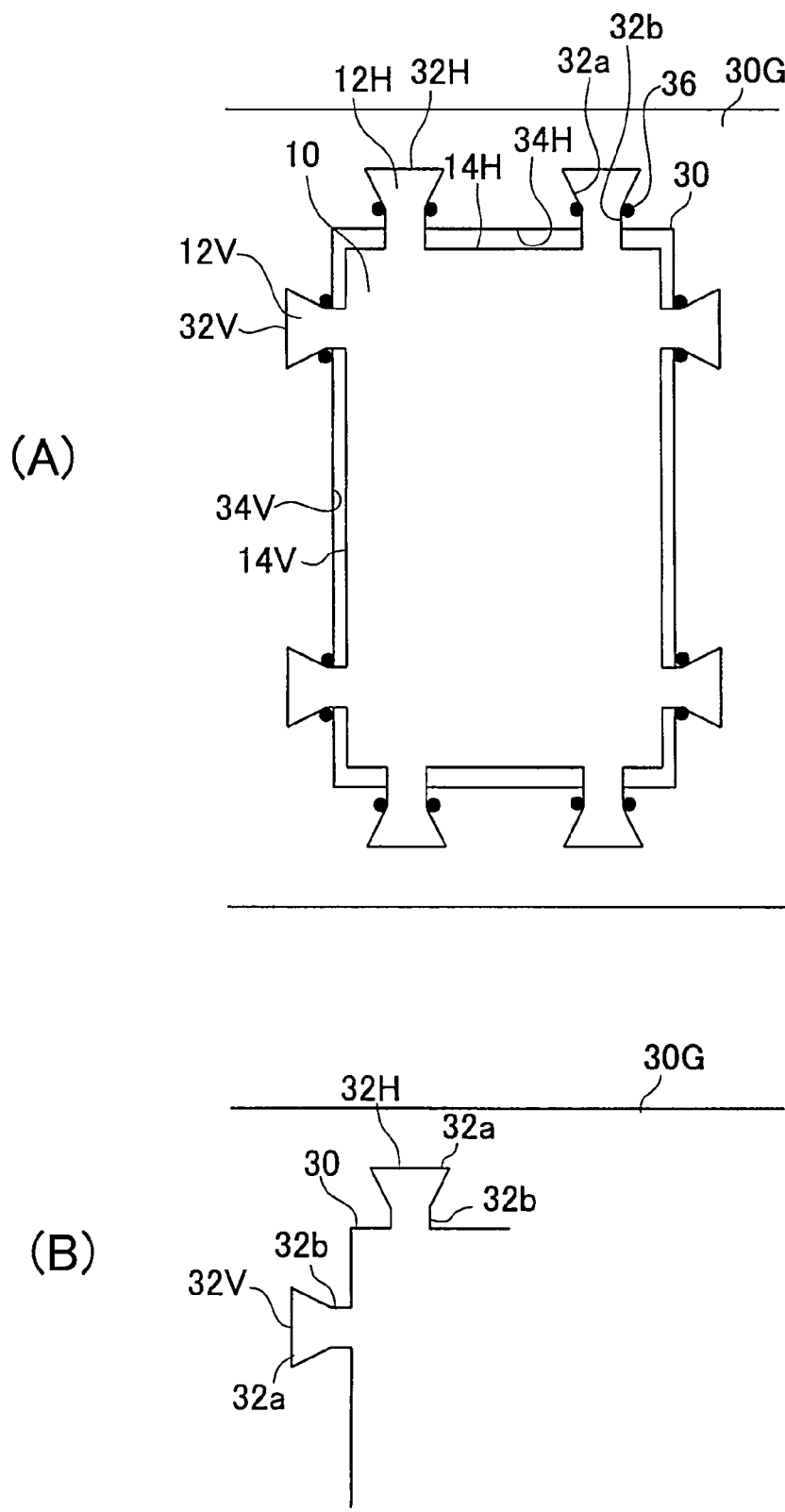
FIG. 5A is a plan view of a crimped printed wiring board.
FIG. 5B is a plan view of a slit.

FIG. 4A is a plan view of an aluminum metal frame (30G). The metal frame (30G) has four accommodation openings 30 which accommodate printed wiring boards, and positioning holes 38 are formed at four corners. In the accommodation opening 30, a vertical wall (34V) abutting the long-side sidewall (14V) of a printed wiring board and a vertical wall (34H) abutting the short-side sidewall (14H) of the printed wiring board are formed; while four slits (32V) abutting the four support portions (12V) of the printed wiring board are formed on the vertical walls (34V), and four slits (32H) abutting the four support portions (12H) of the printed wiring board are formed on the vertical walls (34H). FIG. 5B is an enlarged view of the slits (32H, 32V). The slits (32H, 32V) have the same shape, and are each formed with a base portion (32b) abutting the base portion (bridge portion) (12b) of a rectangular shape of a support portion of the printed wiring board and a trapezoidal portion (32a) abutting the trapezoidal portion (12a) of the support portion of the printed wiring board. The width of the trapezoidal portion (32a) increases toward an outer rim direction of the accommodation opening 30.

Figure 6:
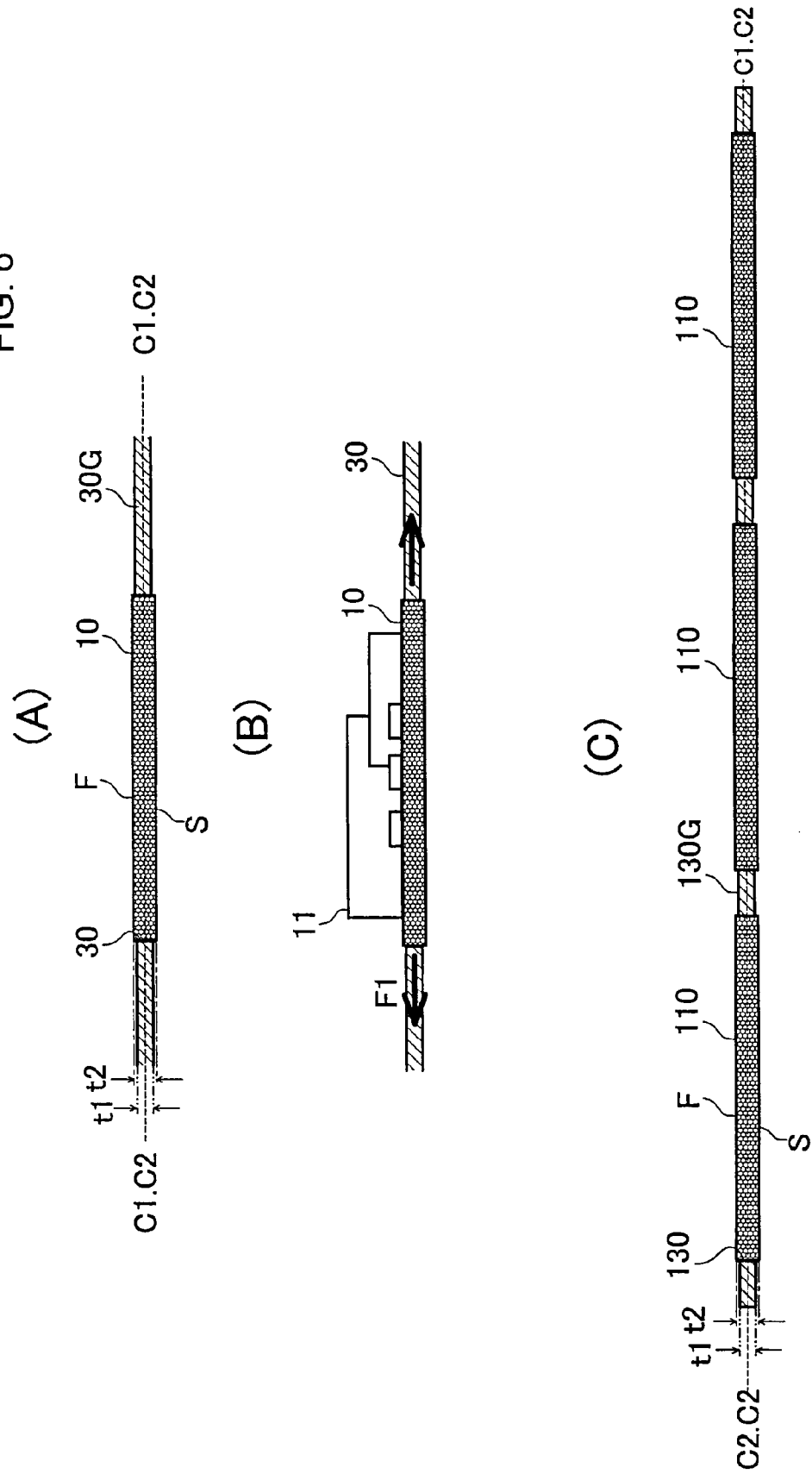
FIGS. 6A-6C are cross-sectional views of a combined wiring board.

FIG. 4B illustrates a state where the printed wiring boards 10 are fixed into all accommodation openings 30 of the metal frame (30G). FIG. 6A illustrates an (X2-X2) cross-section of the printed wiring board 10 in FIG. 4B. The metal frame (30G) is formed to have the thickness (t1) of 750 µm. The printed wiring board 10 is formed to have the thickness (t2) of 780 µm. That is, the metal frame is thinner than the printed wiring board. Further, a center surface (C1) of the metal frame (30G) in a thickness direction aligns with a center surface (C2) of the printed wiring board 10 in the thickness direction. Hence, the metal frame (30G) is recessed from an upper surface (first surface) (F) of the printed wiring board 10, and the metal frame (30G) is recessed from a lower surface (second surface) (S) of the printed wiring board. A thermal expansion coefficient of the aluminum metal frame (30G) in the main surface direction is 23 ppm/° C. and a thermal expansion coefficient of a resin printed wiring board in the main surface direction is 16 ppm/° C., and the thermal expansion coefficient of the metal frame (30G) is higher than the thermal expansion coefficient of the printed wiring board. By setting the thickness of the metal frame thinner than that of the printed wiring board, the thermal expansion coefficients are adjusted so as not cause warping in a printed wiring board. Further, by fixing the printed wiring boards so that the metal frame (30G) is recessed from the upper surface (first surface) (F) of the printed wiring board 10 and the metal frame (30G) is recessed from the lower surface (second surface) (S) of the printed wiring board, the printed wiring boards remain fixed without interference from the metal frame (30G) when the electronic components are mounted on the printed wiring boards. Although aluminum is used as a material of the metal frame in the first embodiment, it is also an option to use copper or stainless steel whose thermal expansion coefficient is higher than the thermal expansion coefficient of the printed wiring board.

FIG. 5A illustrates a state where the printed wiring board 10 is fixed in the accommodation opening 30 of the metal frame (30G). In a state where the support portions (12H) of the printed wiring board are fitted to the slits (32H) of the accommodation opening 30 and the support portions (12V) of the printed wiring board are fitted to the slits (32V), the printed wiring board is fixed in the accommodation opening 30. A predetermined clearance is provided between the long-side sidewall (14V) of the printed wiring board and the vertical wall (34V) of the accommodation opening 30 abutting the long-side sidewall (14V), and a clearance of approximately the same size is also provided between the short-side sidewall (14H) of the printed wiring board and the horizontal wall (34H) of the accommodation opening 30. Crimped portions 36 are formed at boundary portions between the base portions (32b) and the trapezoidal portions (32a) of the slits (32H, 32V) and at portions adjacent to the support portions (12H, 12V), and the crimped portions 36 place the sidewalls of the slits (32H, 32V) in contact with sidewalls of the support portions (12H, 12V) abutting the sidewalls thereof.

Figure 7:
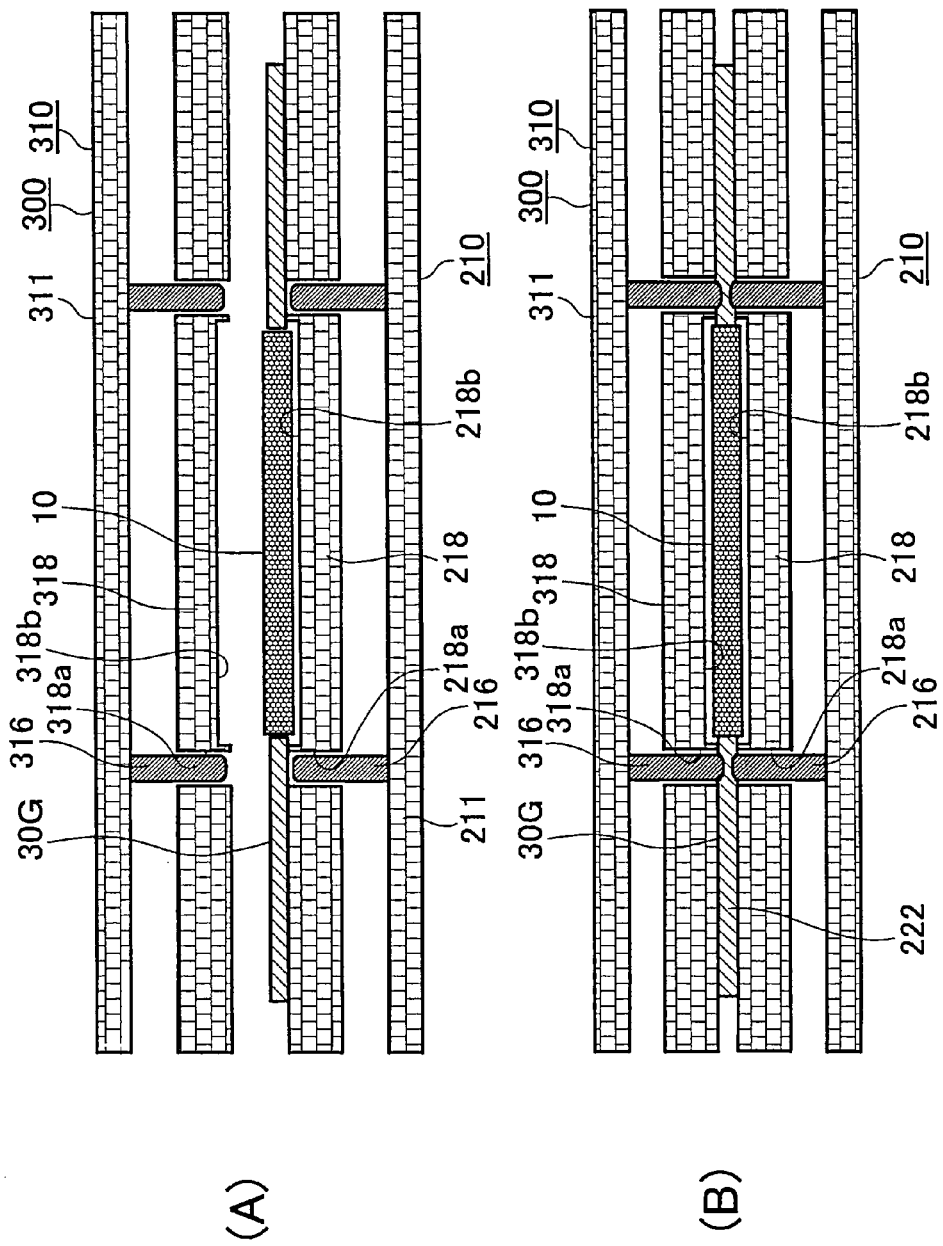
FIGS. 7A-7B are cross-sectional views of a crimping machine according to a first embodiment.

FIG. 7A is a cross-sectional view of a crimping machine 300 which crimps the printed wiring board. The crimping machine 300 has a lower die 210 and an upper die 310. The lower die 210 has a base portion 211 and a support plate 218. The support plate 218 is supported to be movable vertically with respect to the base portion 211. Punches 216 to be crimped are provided on the base portion 211, and penetrating holes (218a) through which the punches 216 are provided are formed in the support plate 218. A concave portion (218b) is formed in the center portion of the support plate 218 to prevent force from being applied to the printed wiring board upon crimping. The printed wiring board 10 is set above the concave portion (218b), and the metal frame (30G) is set on the support plate 218.

The upper die 310 has a base portion 311 and a support plate 318. The support plate 318 is supported to be movable vertically with respect to the base portion 311. Punches 316 to be crimped are provided on the base portion 311, and penetration holes (318a) through which the punches 316 are provided are formed in the support plate 318. The concave portion (318b) is formed in the center portion of the support plate 318.

FIG. 7B illustrates a state where the upper die 310 is pressed against the lower die 210, the punches 316 of the upper die 310 are pressed against the upper surface of the metal frame (30G) and the punches 216 of the lower die 210 are pressed against the lower surface of the metal frame (30G). In each of the four accommodation openings 30 of the metal frame (30G) illustrated in FIG. 4B, the crimped portions 36 are simultaneously formed as illustrated in FIG. 5A. Accordingly, a combined wiring board 100 formed with the printed wiring boards 10 and the metal frame (30G) illustrated in FIG. 4B is completed to be ready for a reflow process.

In the combined wiring board according to the first embodiment, the crimped portions 36 are simultaneously formed in each of the four accommodation openings 30, so that the printed wiring board is positioned accurately in the metal frame (30G). Meanwhile, compared with the printed wiring boards that are fixed by using, for example, an adhesive, crimping is simultaneously performed, so that all printed wiring boards are positioned accurately in the metal frame (30G) and misalignment between the printed wiring boards is minimized. Further, when procedures of filling and curing an adhesive are not conducted, the number of procedures is reduced and, consequently, production efficiency is improved and printed wiring boards are fixed in a metal frame at low cost.

Figure 8:
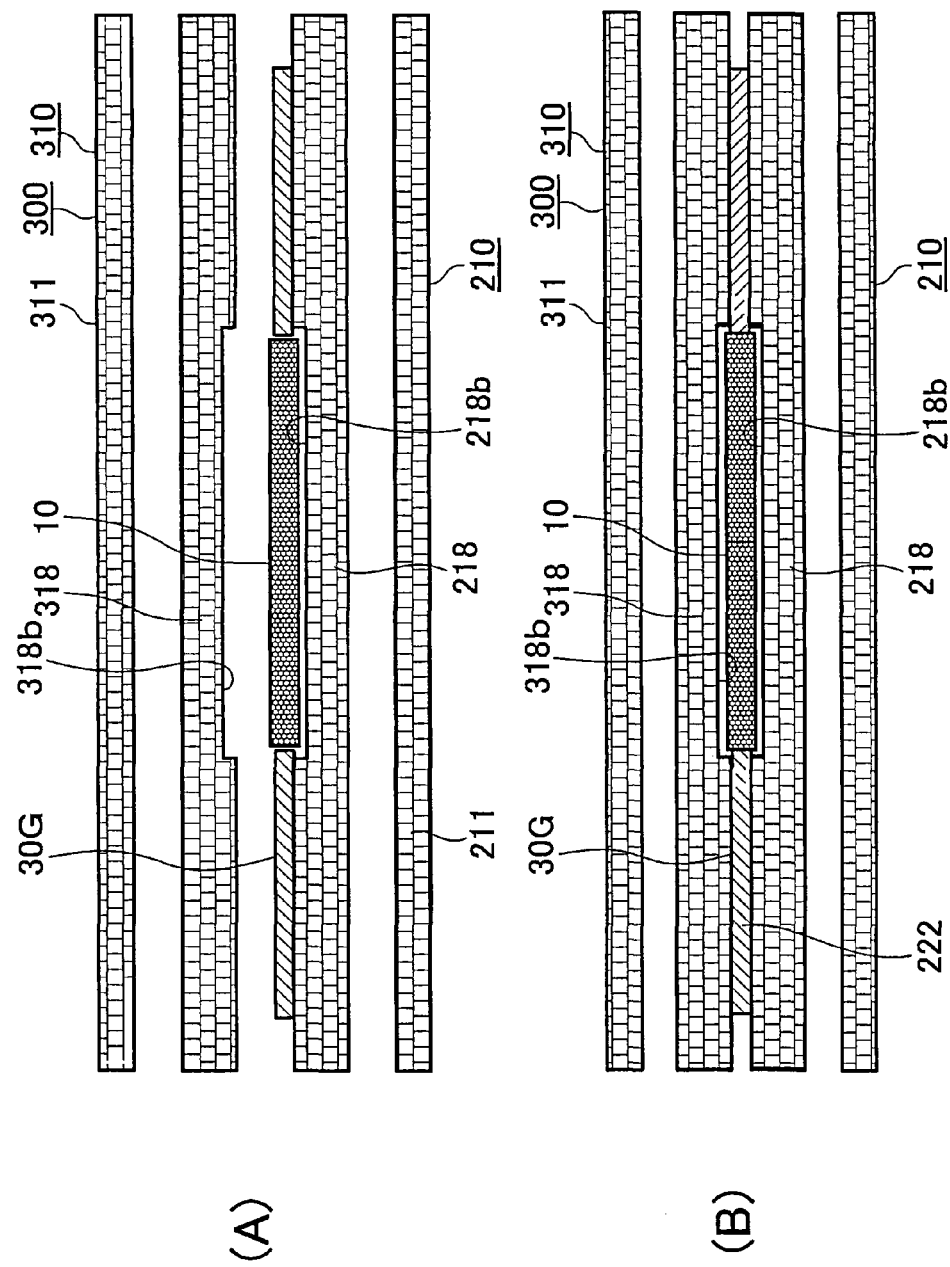
FIGS. 8A-8B are cross-sectional views of a crimping machine according to a first modified example of the first embodiment.

FIG. 8 is a cross-sectional view of the crimping machine 300 according to a first modified example of the first embodiment. According to the first modified example of the first embodiment, instead of using punches, printed wiring boards are fixed in the metal frame (30G) through plastic deformation of an entire metal frame (30G) by force from a support plate 318 of an upper die 310 and a lower-side support plate 218.

In a state where printed wiring boards 10 are fixed in accommodation openings 30 of the metal frame (30G) illustrated in FIG. 5A, solder printing is performed, electronic components are set and the electronic components are mounted in a reflow furnace. A reflow temperature close to 200° C. exceeds Tg (glass transition temperature) of resin that forms a printed wiring board, and therefore the printed wiring board is likely to warp due to the weight of the component to be mounted and the residual stress of the substrate. Here, as shown in FIG. 6(B), stress toward the center of the printed wiring board 10, along with stress caused by the electronic component 11, is generated in the printed wiring board 10 fixed in the metal frame (30G) in the first embodiment. However, since a thermal expansion coefficient of the metal frame (30G) in the main surface direction is higher than a thermal expansion coefficient of the printed wiring board 10 as described above, the metal frame (30G) expands in the planar direction relatively greater than the printed wiring board 10 does. Accordingly, stress (F1) toward the periphery is exerted on the printed wiring board 10 so as to offset the above stress toward the center of the printed wiring board 10 fixed in the accommodation opening 30. As a result, printed wiring boards do not warp in the reflow process.

The printed wiring board according to the first modified example of the first embodiment employs the structure illustrated in FIG. 10, whereby a core material is arranged in a core insulation layer (50M) but core materials are not arranged in interlayer insulation layers (50A, 50C, 50E, 50G, 50I) and interlayer insulation layers (50B, 50D, 50F, 50H, 50J). Hence, although printed wiring boards are likely to warp, a metal frame prevents the printed wiring boards from warping even upon reflow.

Figure 9:
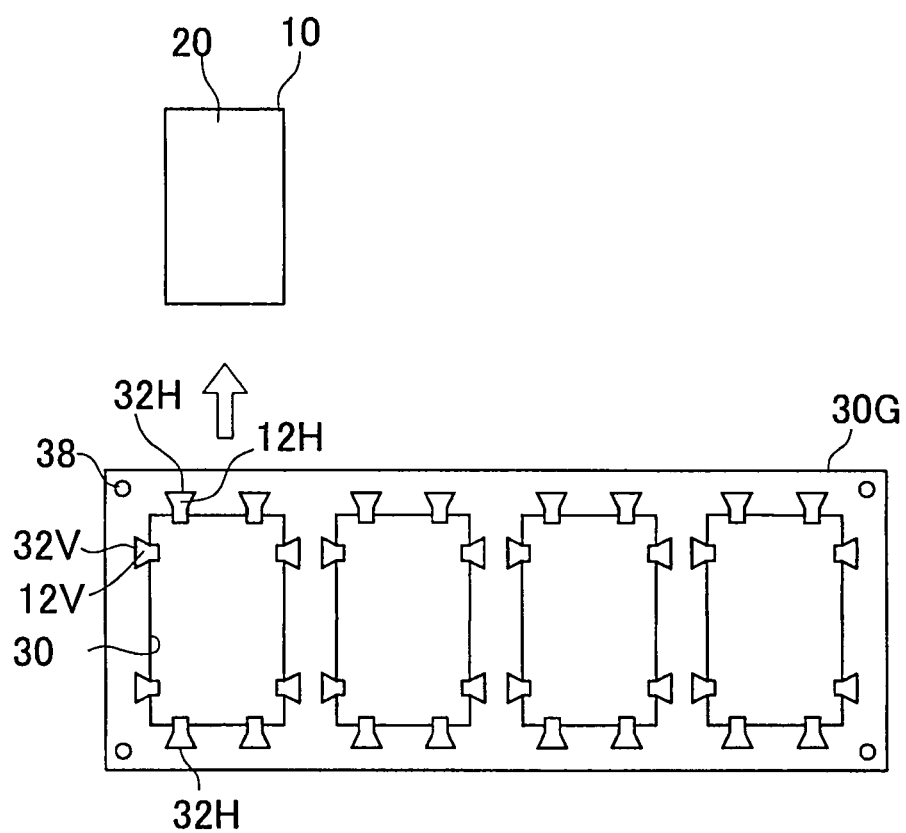
FIG. 9 is a plan view of a printed wiring board cut from a combined wiring board.

After the electronic components are mounted, a rectangular main body portion 20 is cut off from the support portions (12H, 12V) of the printed wiring board as illustrated in FIG. 9, and the main body portion 20 of the printed wiring board is separated in a state where the support portions (12H, 12V) are left in the slits (32H, 32V) of the accommodation opening 30 of the metal frame (30G).

Second Modified Example of First Embodiment

Figure 12:
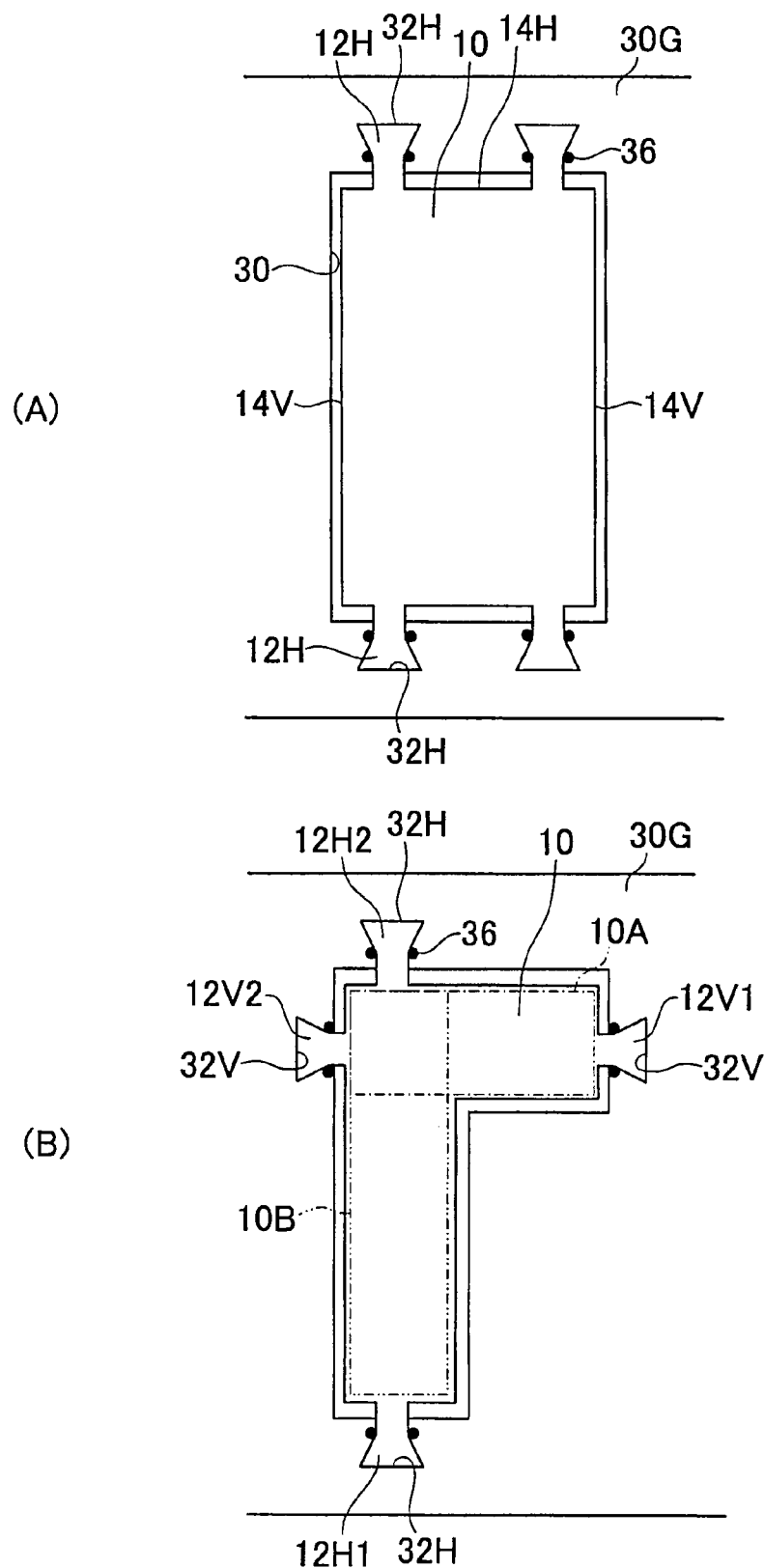
FIG. 12A is a plan view of a combined wiring board according to a second modified example of the first embodiment.
FIG. 12B is a plan view of a combined wiring board according to a third modified example of the first embodiment.

FIG. 12A illustrates a combined wiring board according to a second modified example of the first embodiment.

According to the second modified example of the first embodiment, two support portions (12H) are each formed on a short-side sidewall (14H) on a side of a rectangular main body portion 20 of a printed wiring board 10 to face each other across the main body portion 20. A support portion is not provided on a long-side sidewall (14V). The second modified example of the first embodiment provides such an advantage that processing printed wiring boards is simplified.

Third Modified Example of First Embodiment

FIG. 12B illustrates a combined wiring board according to a third modified example of the first embodiment.

According to the third modified example of the first embodiment, a printed wiring board 10 is formed in an L shape formed by combining a rectangular shape (10A) and a rectangular shape (10B). A support portion (12V1) is formed at an end portion of the L shape on the right long side in FIG. 12B, and a support portion (12V2) is formed at a portion facing the support portion (12V1). Similarly, a support portion (12H1) is formed at an end portion of the L shape on the lower side in FIG. 12B, and a support portion (12H2) is formed at a portion facing the support portion (12H1). That is, the two facing short sides of each of the rectangular shapes (10A, 10B) are connected to an accommodation opening 30 of a metal frame (30G), and the two facing long sides are not connected to the accommodation opening 30. As described in the third modified example of the first embodiment, according to the structure of the first embodiment, printed wiring boards of an arbitrary shape are fixed in a metal frame by providing support portions at opposing portions.

Second Embodiment

Figure 13:
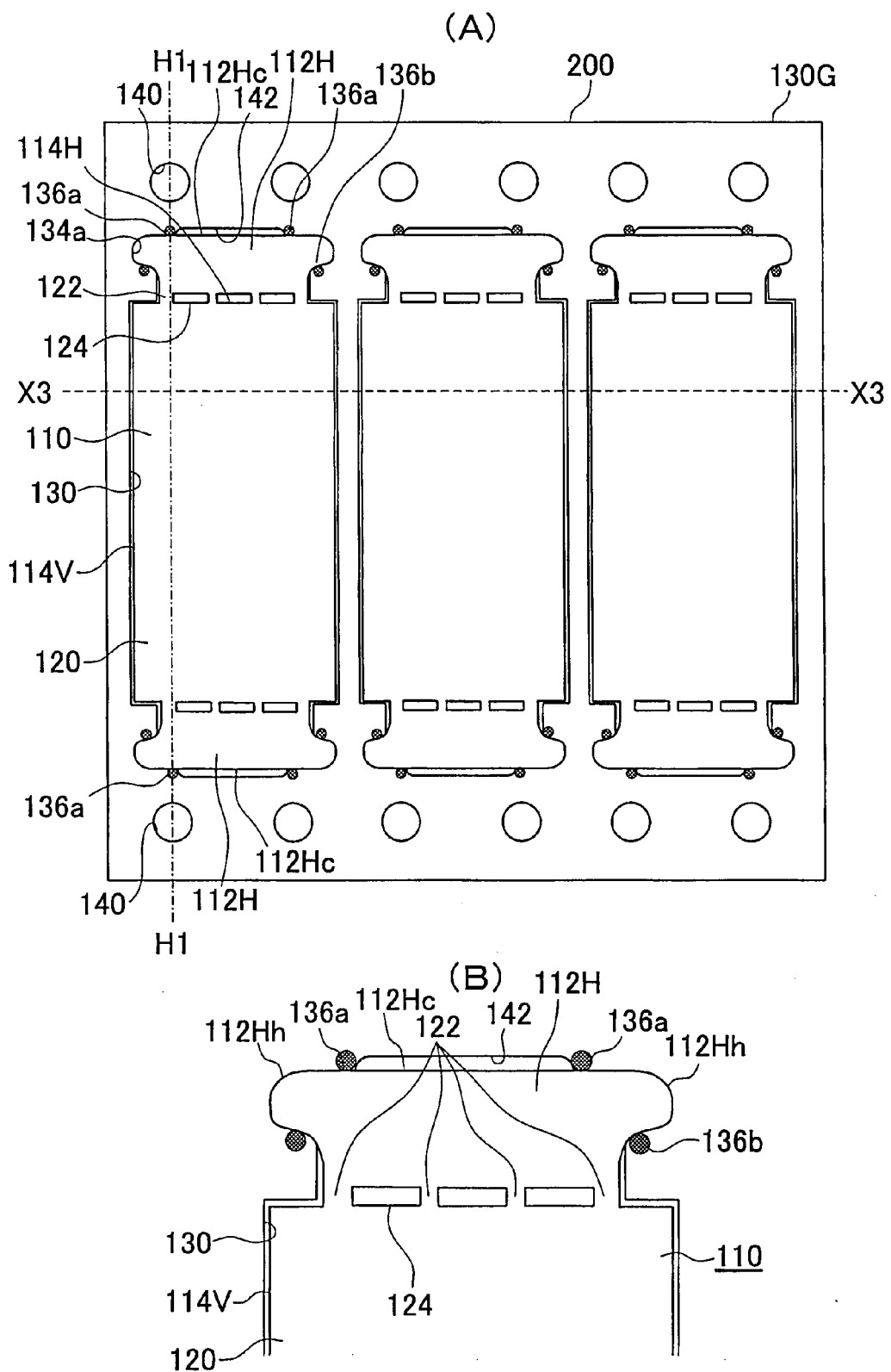
FIG. 13A is a plan view of a combined wiring board according to a second embodiment.
FIG. 13B is a plan view of a support portion of a printed wiring board.

FIG. 13A illustrates a combined wiring board 200 according to a second embodiment.

Printed wiring boards 110 are fixed in three accommodation openings 130 of a metal frame (130G). FIG. 6C illustrates an (X3-X3) cross-section of the combined wiring board in FIG. 13A. The metal frame (130G) is formed to have the thickness (t1) of 750 μm. The printed wiring board 110 is formed to have the thickness (t2) of 780 μm. Further, a center surface (C1) of the metal frame (130G) in a thickness direction aligns with a center surface (C2) of the printed wiring board 110 in the thickness direction. Hence, the metal frame (130G) is recessed from an upper surface (first surface) (F) of the printed wiring board 110, and the metal frame (130G) is recessed from a lower surface (second surface) (S) of the printed wiring board 110. A thermal expansion coefficient of the aluminum metal frame (130G) in the main surface direction is 23 ppm/° C. and a thermal expansion coefficient of a resin printed wiring board in the main direction is 16 ppm/° C.

In the printed wiring board 110, one support portion (112H) is formed on a short-side sidewall (114H) on a side of a rectangular main body portion 120 to face each other across the main body portion 120. The main body portion 120 and the support portion (112H) are connected by a bridge portion 122 formed by slits 124. As illustrated in FIG. 13(B), the bridge portion 122 is formed between the slits 124 and between a slit and the sidewall.

At the support portion (112H), a pair of extension pieces (112Hh) with a width increasing in substantially a U shape is formed at lateral portions, and crimped portions (136a, 136b) are formed at a base portion of the extension piece (112Hh). The crimped portions (136a, 136b) place the sidewalls of the accommodation opening 130 in contact with the sidewalls of the extension pieces (112Hh) abutting the sidewalls thereof. At portions other than the extension pieces (112Hh) fixed by the crimped portions (136a, 136b), the sidewalls of the printed wiring board and the sidewalls of the accommodation opening are not in contact with each other. Further, a linear portion (112Hc) between the crimped portion (136a) and the crimped portion (136a), and a concave portion 142 are formed in the accommodation opening 130 to prevent interference. Accordingly, stress is prevented from being exerted on the linear portion (112Hc) when the printed wiring board undergoes thermal contraction. Similarly, a clearance is provided between the long-side sidewall (114V) of the main body portion 120 and the accommodation opening 130. As indicated by a dashed line (H1-H1) in FIG. 13A, openings 140 are provided on a line connecting the crimped portion (136a) positioned at an end portion of the linear portion (112Hc) of one support portion (112H) and the crimped portion (136a) positioned at an end portion of the linear portion (112Hc) of the other support portion (112H), thus buffering excessive stress to be exerted vertically on a printed wiring board when a reflow process is performed. In addition, the slits 124 of a printed wiring board are arranged hedging the line connecting a pair of the crimped portion (136a) and the crimped portion (136a) to uniformly mitigate stress in the printed wiring board.

FIG. 14A illustrates the metal frame (130G) in which the bridge portions 122 between the slits 124 are cut and the main body portion 120 of the printed wiring board illustrated in FIG. 14B is separated. The support portions (112H) of the printed wiring board are left on the metal frame (130G) side. According to the second embodiment, the slits 124 are provided in advance, so that the main body portion 120 of the printed wiring board is easily separated.

Third Embodiment

Figure 15:
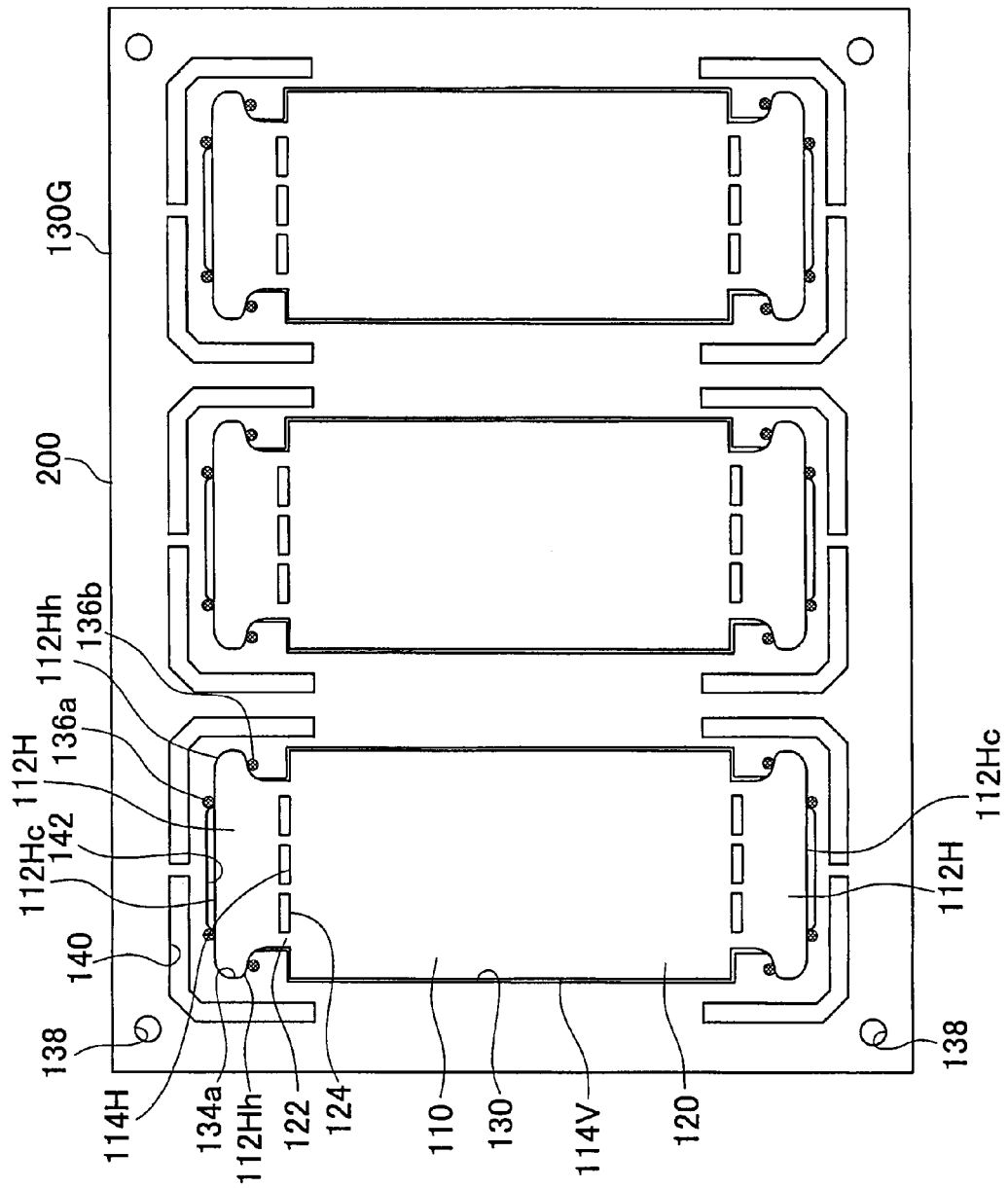
FIG. 15 is a plan view of a combined wiring board according to a third embodiment.

FIG. 15 illustrates a combined wiring board 200 according to a third embodiment.

Printed wiring boards 110 are fixed in three accommodation openings 130 of a metal frame (130G) by crimped portions (136a, 136b). In the metal frame (130G), L-shaped slits 140 are provided at four portions to surround four corner directions of an opening 130.

Figure 16:
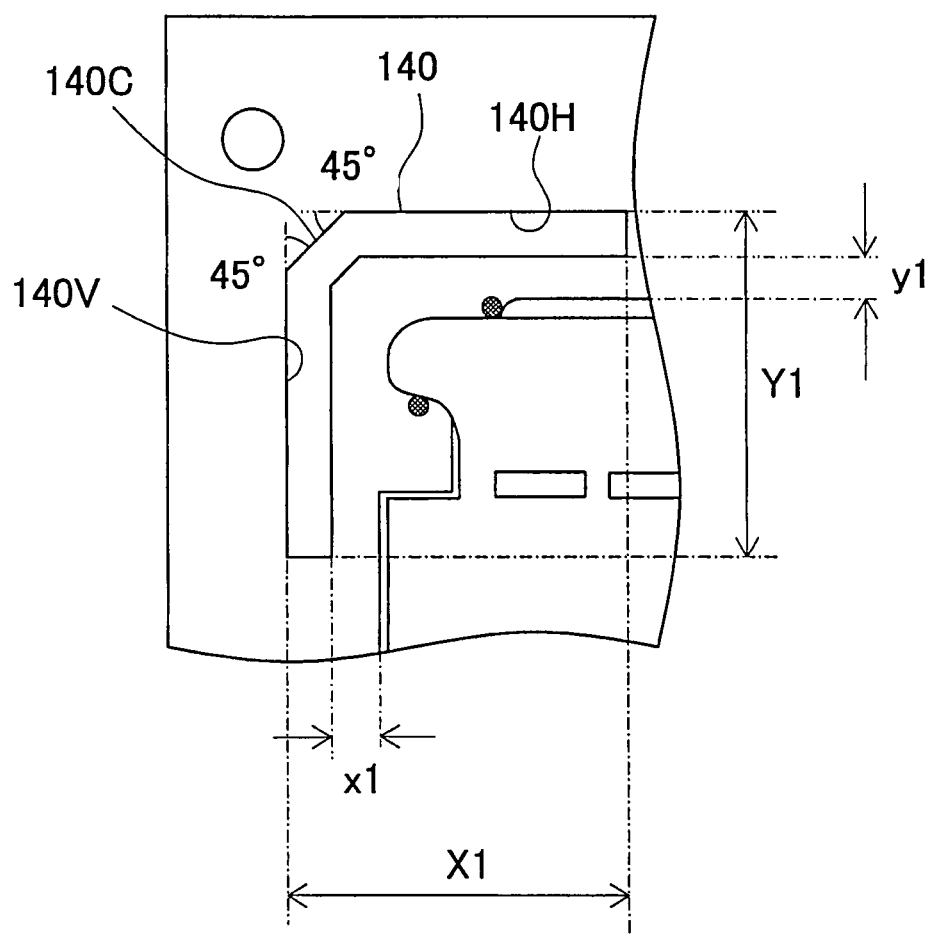
FIG. 16 is an enlarged view of an L-shaped slit in FIG. 15.

FIG. 16 is an enlarged view of the L-shaped slit 140. The L-shaped slit 140 is formed with a first linear portion (140H) formed in a longitudinal direction of the metal frame (130G), a second linear portion (140V) provided at a right angle to the first linear portion and in a lateral direction of the metal frame (130G), and a third linear portion (140C) between the first linear portion and the second linear portion. An angle formed between an extended line of the first linear portion (140H) and the third linear portion (140C) is 45 degrees, and an angle formed between an extended line of the second linear portion (140V) and the third linear portion (140C) is approximately 45 degrees. A length (a length of an L-shaped slit in an (X) direction) (X1) obtained by adding a length of the third linear portion (140C) in the direction of the first linear portion to the length of the first linear portion (140H) is 18 mm. A length (a length of an L-shaped slit in a (Y) direction) (Y1) obtained by adding a length of the third linear portion (140C) in the direction of the second linear portion to the length of the second linear portion (140V) is 18 mm. The lengths of the first linear portion (140H) and the second linear portion (140V) are equal.

The same as in the second embodiment, the metal frame (130G) is formed to have a thickness of 750 μm, and a printed wiring board 110 is formed to have a thickness of 780 μm. Further, a center surface of the metal frame (130G) in a thickness direction aligns with a center surface of the printed wiring board 110 in the thickness direction. Hence, the metal frame (130G) is recessed from an upper surface (first surface) (F) of the printed wiring board 110, and the metal frame (130G) is recessed from a lower surface (second surface) (S) of the printed wiring board 110. A thermal expansion coefficient of the aluminum metal frame (130G) in the main surface direction is 23 ppm/° C., and a thermal expansion coefficient of a resin printed wiring board in the main direction is 16 ppm/° C.

As illustrated in FIG. 15, similar to the second embodiment, in the printed wiring board 110, one support portion (112H) is formed on a short-side sidewall (114H) on one side of a main body portion 120 of a rectangular shape to face each other across the main body portion 120. The main body portion 120 and the support portion (112H) are connected by a bridge portion 122 formed by slits 124.

At the support portion (112H) of the printed wiring board 110 according to the third embodiment, a pair of extension pieces (112Hh) with a width increasing in substantially a U shape is formed on lateral portions, and crimped portions (136a, 136b) are formed on a base portion of the extension piece (112Hh). The crimped portions (136a, 136b) place the sidewalls of the accommodation opening 130 in contact with the sidewalls of the extension pieces (112Hh) abutting the sidewalls thereof. At portions other than the extension pieces (112Hh) fixed by the crimped portions (136a, 136b), the sidewalls of the printed wiring board and the sidewalls of the accommodation opening are not in contact with each other. Further, a linear portion (112Hc) between the crimped portion (136a) and the crimped portion (136a), and a concave portion 142 are formed in the accommodation opening 130 to prevent interference. Accordingly, stress is prevented from being exerted on the linear portion (112Hc) when the printed wiring board undergoes thermal contraction. Similarly, a clearance is provided between the long-side sidewall (114V) of the main body portion 120 and the accommodation opening 130. While stress in a longitudinal direction of the printed wiring board is exerted on each crimped portion (136a) provided at an end portion of the linear portion (112Hc) of the support portion (112H), the L-shaped slit 140 is provided on the extended line from the longitudinal direction of the printed wiring board on which stress is exerted. Meanwhile, while stress in a lateral direction of the printed wiring board is exerted on each crimped portion (136a), the L-shaped slit 140 is provided on the extended line from the lateral direction of the printed wiring board on which stress is exerted. Consequently, when a reflow process is performed, stress is uniformly mitigated in a printed wiring board, and warping is unlikely to occur in the printed wiring board.

In addition, a frame component such as metal frames (30G, 130G) in the first, second and third embodiments is preferred to have higher rigidity than that of a piece component such as a printed wiring board 10 at a solder reflow temperature.

When an electronic component is being mounted on a wiring board, a solder reflow temperature exceeds Tg (glass transition temperature) of a material forming the wiring board, resulting in a problem whereby the wiring board warps due to the weight of the component to be mounted and the residual stress of a substrate.

A combined wiring board according to an embodiment of the present invention has printed wiring boards which do not warp when reflow is performed to mount electronic components.

A combined wiring board according to an embodiment of the present invention has the following technical features: a piece component formed with a wiring board; and a frame component which has an accommodation opening that surrounds the piece component and fixes an outer rim of the piece component to the accommodation opening. In such a combined wiring board, a thermal expansion coefficient of the frame component in a planar direction is set higher than a thermal expansion coefficient of the piece component in the planar direction.

In a combined wiring board according to an embodiment of the present invention, a thermal expansion coefficient of a frame component that fixes outer peripheries of piece components in a planar direction is set higher than thermal expansion coefficients of the piece components. Thus, the piece components are pulled in an outer rim direction by the thermal expansion of the frame component upon reflow and the piece components are unlikely to warp.

Obviously, numerous modifications and variations of the present invention are possible in light of the above teachings. It is therefore to be understood that within the scope of the appended claims, the invention may be practiced otherwise than as specifically described herein.

What is claimed is:

1. A combined wiring board, comprising:
    a plurality of piece components each comprising a wiring board; and
    a frame component having an accommodation opening structure and holding the plurality of piece components in the accommodation opening structure such that each of the piece components is fixed to the frame component in contact at an outer rim of each of the piece components,
    wherein the frame component has a thermal expansion coefficient in a planar direction which is set higher than a thermal expansion coefficient of the wiring board in each of the piece components in the planar direction.

2. The combined wiring board according to claim 1, wherein the frame component has a thickness which is less than a thickness of the piece components.

3. The combined wiring board according to claim 1, wherein the frame component has a front surface which is recessed from front surfaces of the piece components and a back surface which is recessed from back surfaces of the piece components.

4. The combined wiring board according to claim 1, wherein the piece components are held in the accommodation opening structure of the frame component such that each of the piece components is connected to the frame component at opposing side walls of each of the piece components.

5. The combined wiring board according to claim 1, wherein each of the piece components has a shape including at least one rectangle, the piece components are held in the accommodation opening structure of the frame component such that each of the piece components is connected to the frame component at opposing short-side side walls of each of the piece components, and each of the piece components has opposing long-side side walls which are not connected to the frame component.

6. The combined wiring board according to claim 1, wherein the piece components are held in the accommodation opening structure of the frame component such that each of the piece components is connected to the frame component at opposing portions of each of the piece components.

7. The combined wiring board according to claim 1, wherein each of the piece components includes a core substrate comprising a core material and a build-up structure formed on the core substrate and comprising an interlayer insulation layer, a conductive layer, and the interlayer insulation layer of the build-up layer does not contain a core material.

8. The combined wiring board according to claim 1, wherein each of the piece components has a body portion, a support portion and a bridge portion connecting the body portion and the support portion, and the piece components are held in the accommodation opening structure of the frame component such that each of the piece components is fixed to the frame component through the support portion of each of the piece components.

9. The combined wiring board according to claim 1, wherein the plurality of piece components has a plurality of support portions, respectively, each of the support portions is tapering toward an end of each of the support portions, and the frame component has a plurality of support slit portions configured to engage with the plurality of support portions, respectively, such that each of the piece components is fixed to the frame component through the support portion of each of the piece components.

10. The combined wiring board according to claim 9, wherein each of the support slit portions of the frame component is configured to engage with each of the support portions such that the support portions form contact with the support slit portions of the frame component, respectively.

11. The combined wiring board according to claim 1, wherein each of the piece components comprises a resin material, and the frame component comprises a metal plate.

12. The combined wiring board according to claim 1, wherein the accommodation opening structure of the frame component comprises a plurality of accommodation openings formed such that the plurality of accommodation openings accommodates the plurality of piece components, respectively, and the frame component has a plurality of slit portions each having an L shape such that the plurality of slit portions is positioned to surround four corners of each of the accommodation openings of the frame component.

13. The combined wiring board according to claim 12, wherein the L shape of each of the slit portions has a first linear section, a second linear section perpendicular to the first linear section and a third linear section between the first linear section and the second linear section such that the first linear section and the third linear section form substantially an angle of 45 degree and that the second linear section and the third linear section form substantially an angle of 45 degree.

14. The combined wiring board according to claim 13, wherein the first linear section and second linear section of the L shape of each of the slit portions has substantially an equal length.

15. The combined wiring board according to claim 1, wherein the accommodation opening structure of the frame component comprises a plurality of accommodation openings.

16. The combined wiring board according to claim 15, wherein the frame component has a thickness which is less than a thickness of the piece components.

17. The combined wiring board according to claim 15, wherein the frame component has a front surface which is recessed from front surfaces of the piece components and a back surface which is recessed from back surfaces of the piece components.

18. The combined wiring board according to claim 15, wherein the piece components are held in the accommodation openings of the frame component respectively such that each of the piece components is connected to the frame component at opposing side walls of each of the piece components.

19. The combined wiring board according to claim 15, wherein each of the piece components has a shape including at least one rectangle, the piece components are held in the accommodation openings of the frame component respectively such that each of the piece components is connected to the frame component at opposing short-side side walls of each of the piece components, and each of the piece components has opposing long-side side walls which are not connected to the frame component.

20. The combined wiring board according to claim 15, wherein the piece components are held in the accommodation openings of the frame component respectively such that each of the piece components is connected to the frame component at opposing portions of each of the piece components.

* * * * *